(12) United States Patent
Xu et al.

(10) Patent No.: US 8,472,896 B2
(45) Date of Patent: Jun. 25, 2013

(54) METHOD AND APPARATUS FOR TRANSFORMER POWER COMBINER AND DYNAMIC POWER CONTROL FOR OUTPHASING POWER AMPLIFIERS

(75) Inventors: Hongtao Xu, Beaverton, OR (US);
Georgios Palaskas, Portland, OR (US);
Ashoke Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 346 days.

(21) Appl. No.: 12/879,252

(22) Filed: Sep. 10, 2010

(65) Prior Publication Data

US 2012/0062318 A1 Mar. 15, 2012

(51) Int. Cl.
*H04B 1/04* (2006.01)

(52) U.S. Cl.
USPC .......... 455/110; 455/91; 455/108; 455/114.3; 455/115.1; 375/296; 375/297; 375/300; 375/302; 332/103; 332/45; 330/10; 330/124

(58) Field of Classification Search
USPC .......... 455/91, 108, 114.3, 115.1, 110, 127.1, 455/127.3; 375/296, 297, 300, 302, 312; 332/103, 145; 330/10, 124
See application file for complete search history.

(56) References Cited

U.S. PATENT DOCUMENTS

| | | | |
|---|---|---|---|
| 6,201,452 B1 * | 3/2001 | Dent et al. | 332/103 |
| 2005/0110590 A1 * | 5/2005 | Korol | 332/149 |
| 2009/0034603 A1 * | 2/2009 | Lakdawala et al. | 375/238 |
| 2009/0176462 A1 * | 7/2009 | Elmala | 455/101 |

* cited by examiner

*Primary Examiner* — Tuan Pham
(74) *Attorney, Agent, or Firm* — Kacvinsky Daisak PLLC

(57) ABSTRACT

A method, system, apparatus and article are described for optimizing transformer power combiners and for dynamically controlling power for outphasing power amplifiers. In some embodiments, for example, an apparatus may comprise one or more outphasing power amplifiers, one or more phase modulator modules coupled to and operative to dynamically control the one or more outphasing power amplifiers, and one or more power combiners coupled to and operative to combine outputs from the one or more outphasing power amplifiers, wherein the one or more power combiners comprise transformer power combiners arranged to combine outphasing signals using a primary inductor and differential signals using a secondary inductor. Other embodiments are described and claimed.

22 Claims, 10 Drawing Sheets

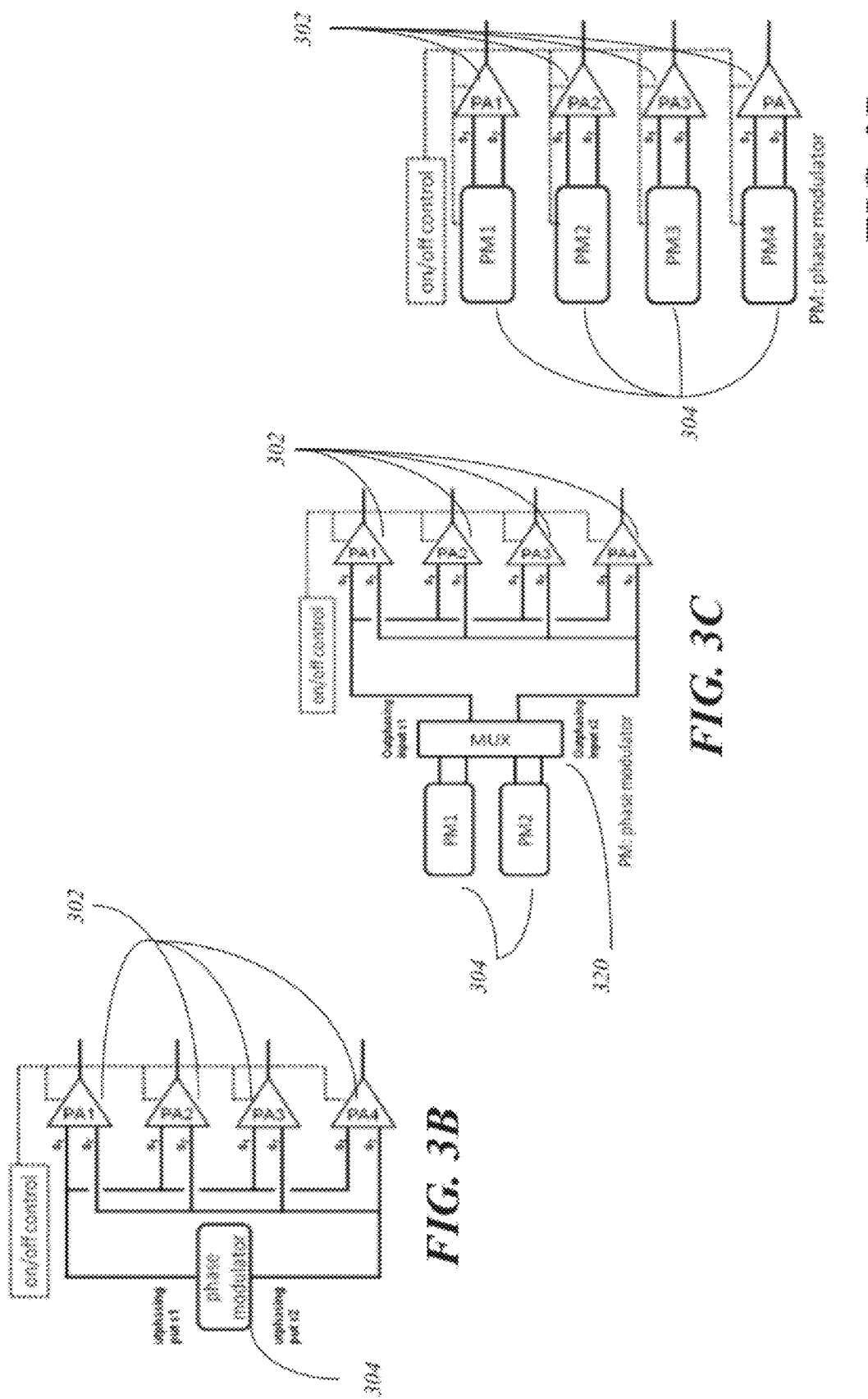

400

RECEIVE A POSITIVE COMPONENT OF A FIRST DIGITAL SIGNAL AT A FIRST OUTPHASING POWER AMPLIFIER, A NEGATIVE COMPONENT OF THE FIRST DIGITAL SIGNAL AT A SECOND OUTPHASING POWER AMPLIFIER, A POSITIVE COMPONENT OF A SECOND DIGITAL SIGNAL AT A THIRD OUTPHASING POWER AMPLIFIER AND A NEGATIVE COMPONENT OF THE SECOND DIGITAL SIGNAL AT A FOURTH OUTPHASING POWER AMPLIFIER
402

COMBINE OUTPUTS OF THE FIRST AND FOURTH OUTPHASING POWER AMPLIFIERS AND OUTPUTS OF THE SECOND AND THIRD OUTPHASING POWER AMPLIFIERS USING A PRIMARY AND A SECONDARY INDUCTOR.
404

*FIG. 4*

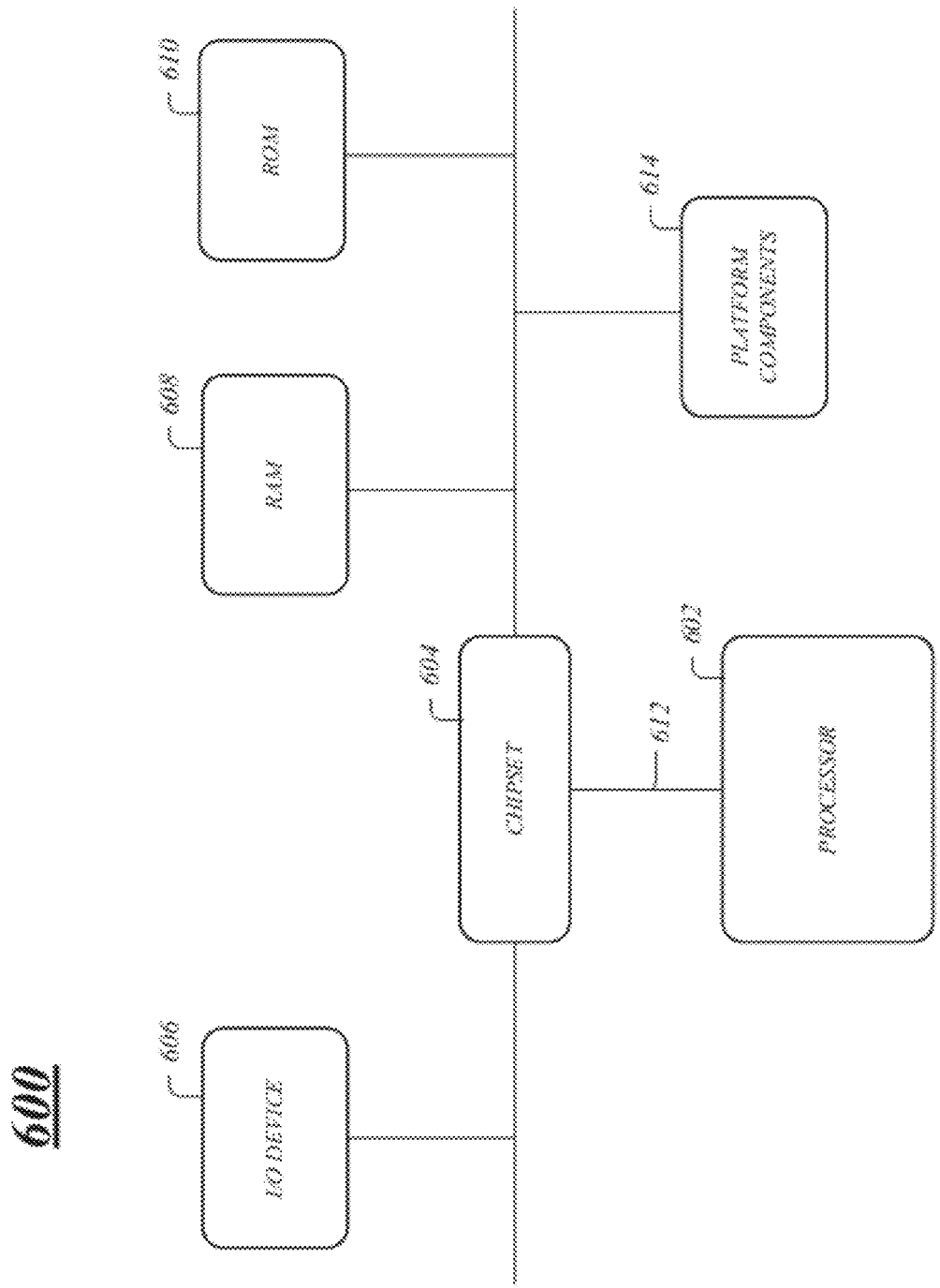

US 8,472,896 B2

METHOD AND APPARATUS FOR TRANSFORMER POWER COMBINER AND DYNAMIC POWER CONTROL FOR OUTPHASING POWER AMPLIFIERS

BACKGROUND

Wireless communication systems communicate information over a shared wireless communication medium such as one or more portions of the radio-frequency (RF) spectrum. Recent innovations in mobile computing devices and the increased availability and demand for advanced, interactive, multimedia and other data services have resulted in increased demands placed on wireless communications systems and mobile computing devices. Furthermore, power conservation and efficiency are important considerations when implementing or designing wireless communications systems and mobile computing devices. One particular area that results in increased power usage for a mobile computing device is a wireless transceiver. As the number, type and complexity of wireless communication connections and wireless transceivers continues to increase, the demands placed on mobile computing devices also increase. Consequently, techniques designed to manage power for wireless transceivers are desirable.

BRIEF DESCRIPTION OF THE DRAWINGS

FIG. 3B illustrates one embodiment of a fifth apparatus.
FIG. 3C illustrates one embodiment of a sixth apparatus.
FIG. 3D illustrates one embodiment of a seventh apparatus.
FIG. 4 illustrates one embodiment of a logic flow.
FIG. 6 illustrates one embodiment of a second apparatus.

DETAILED DESCRIPTION

Various embodiments may be generally directed to one or more transformer power combiners and to dynamic power control for outphasing power amplifiers. Some embodiments may be particularly directed to an enhanced design for a transformer power combiner for outphasing power amplifiers. Various embodiments may also be particularly directed to dynamic power control for outphasing power amplifiers. Other embodiments are described and claimed.

In various embodiments, mobile computing devices may have a limited power supply, such as a battery. As mobile computing devices continue to increase in complexity and functionality, power consumption becomes an increasingly more important consideration when designing and using the device. One area or component of a mobile computing device that consumes a relatively large amount of power is the one or more wireless transceivers of the mobile computing device that are used to establish and maintain wireless communication connections.

In some embodiments, the one or more wireless transceivers may comprise a digital outphasing transceiver. In various embodiments, the digital outphasing transceiver may include an outphasing transmitter arranged to decompose a signal with amplitude and phase information into two constant-amplitude (digital) signals with only phase modulation. This may allow for processing of the signals with high-efficiency, switching power amplifiers (PA). In some embodiments, use of a proper type of power combiner may result in a boost in back-off efficiency in the outphasing system. A general drain efficiency curve comparing an outphasing transmitter utilizing switching PAs to a transmitter utilizing a more generic class-B PA is shown in FIG. 2C, for example.

In various embodiments, there are several other factors that also limit the back-off efficiency. One factor, for example, is the fixed power consumption associated with any outphasing angles. Because switching PAs in the system are always on and constantly operating at peak output drain voltage swings in some embodiments, power may be dissipated on the fixed resistive load in the matching network. This loss may become significant and it may degrade efficiency at back-off power.

Figure 2A:
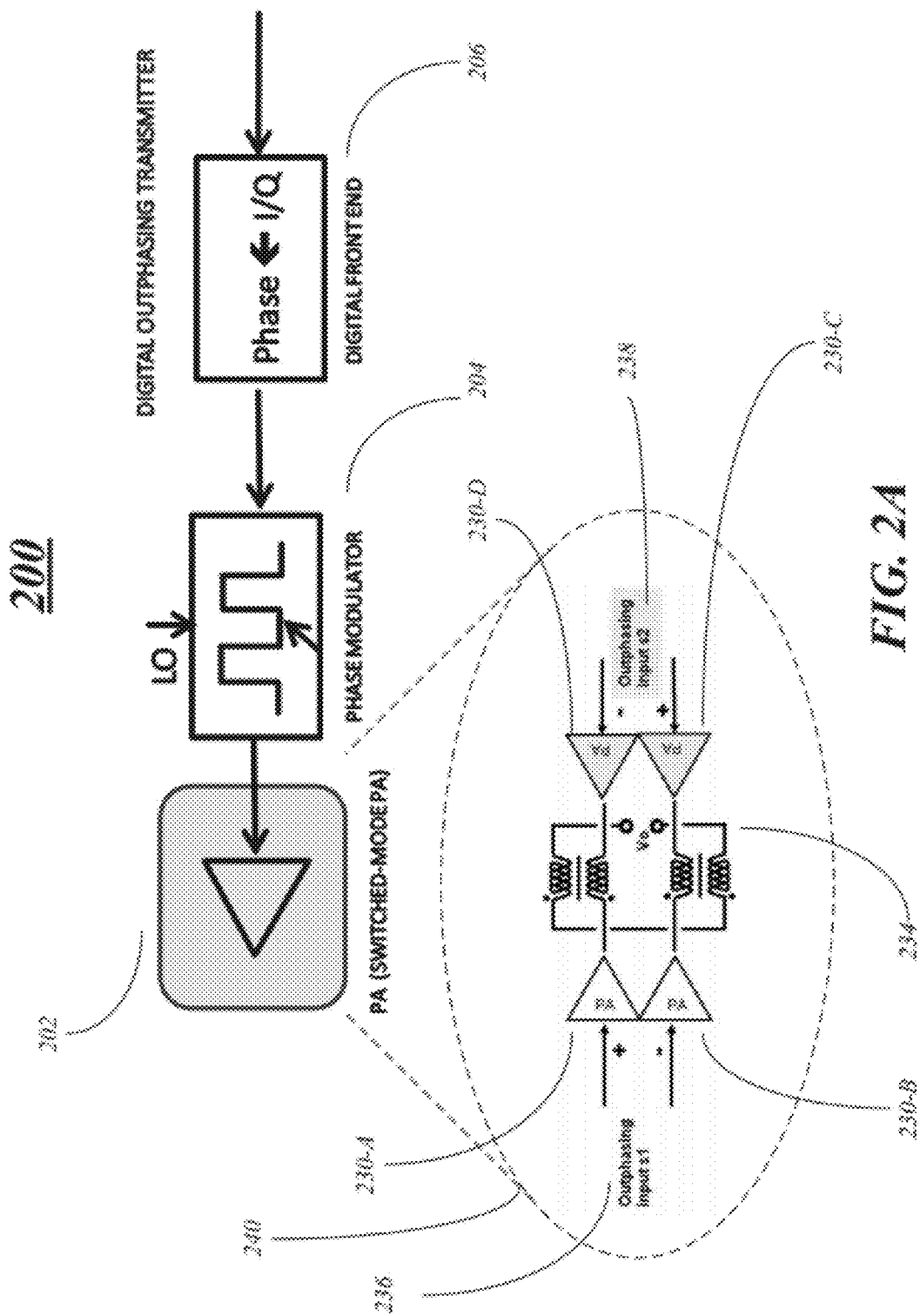
FIG. 2A illustrates one embodiment of a second apparatus.
Figure 2B:
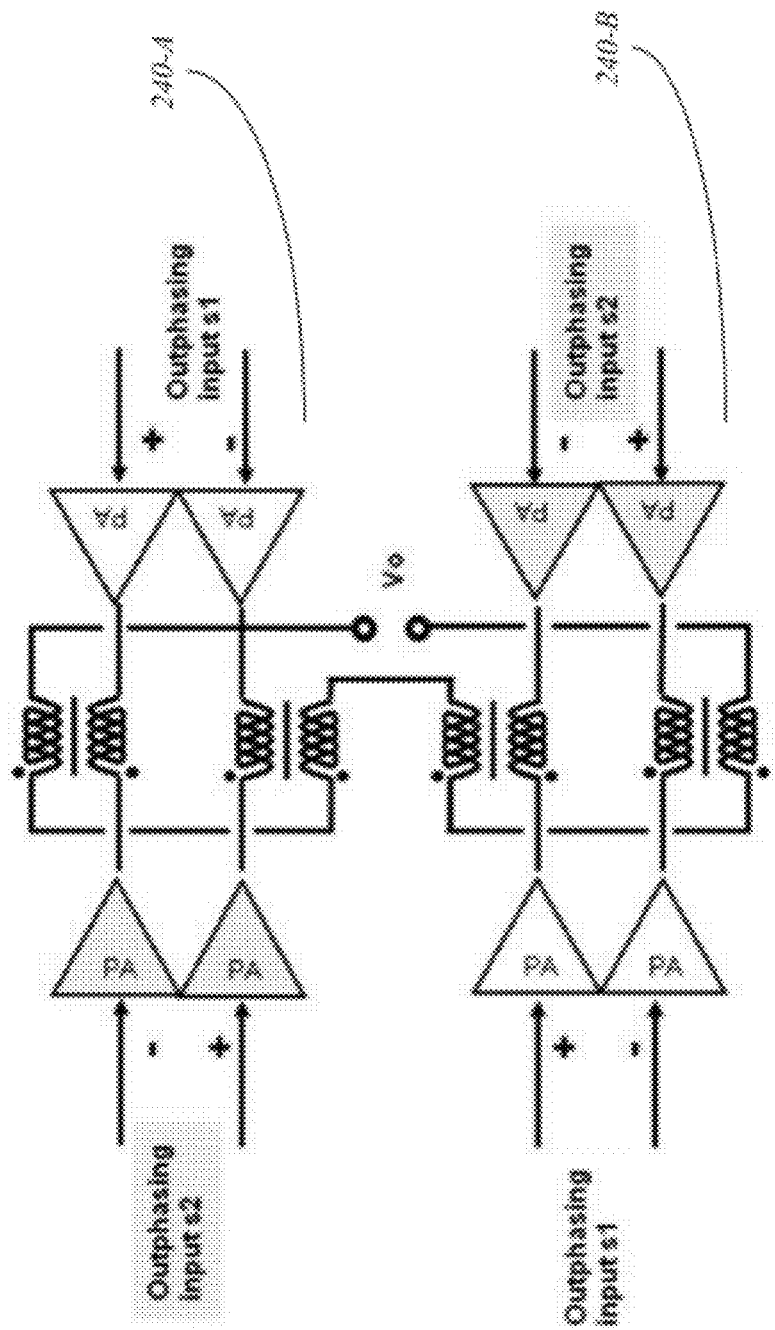
FIG. 2B illustrates one embodiment of a third apparatus.
Figure 2C:
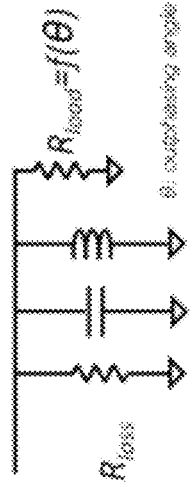
FIG. 2C illustrates one embodiment of a first graph.
Figure 2D:
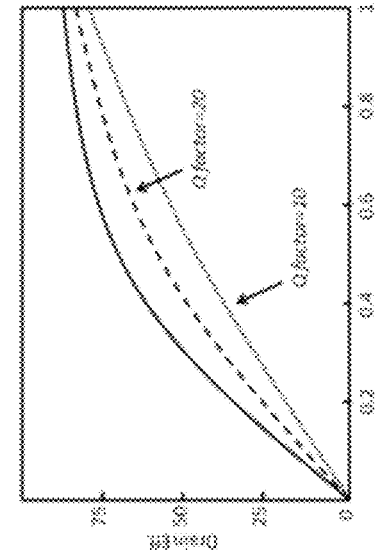
FIG. 2D illustrates one embodiment of a first circuit.
Figure 2F:
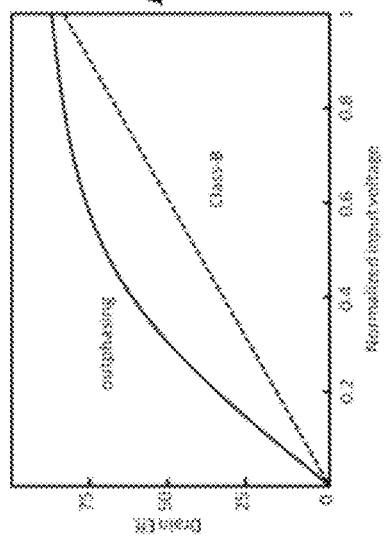
FIG. 2F illustrates one embodiment of a second circuit.
Figure 2E:
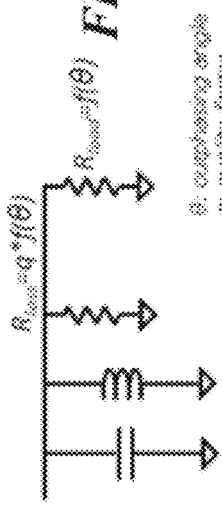
FIG. 2E illustrates one embodiment of a second graph.

FIG. 2D illustrates a typical equivalent output matching network. In an outphasing system, $R_{load}$ may be modulated with outphasing angle $\theta$, but $R_{loss}$ may be constant in the matching network. FIG. 2E shows how back-off efficiency changes with higher fixed loss in some embodiments. Resistive loss in the matching network may be generally defined as Q factor. In various embodiments, efficiency may drop much faster at a back-off power level than at a peak level when Q is smaller. This, in some embodiments, may make it more difficult to implement a high quality outphasing system with low Q factor matching. In various embodiments, this may be particularly true for CMOS designs.

Transformer power combiners may be used in the PA designs to deliver high output power in some embodiments. In various embodiments, to reduce or minimize the efficiency degradation due to loss in the matching networks, a new outphasing transformer combiner scheme may be desirable. For example, an architecture may be configured to allow for both $R_{load}$ and $R_{loss}$ to be modulated with outphasing angle $\theta$ through primary inductors and outphased RF power to be combined through secondary inductors. In some embodiments, the new structure may also maintain differential PA pair groups that may be critical for CMOS PA design in order to minimize parasitic ground inductance. Consequently, techniques for an improved power combiner design for outphasing power amplifiers is desirable.

In various embodiments, an overall outphasing PA system efficiency also includes power consumption in the PA driver. For example, in outphasing PAs, it may be a constant power consumption that becomes significant when output power is low. In some embodiments, this may be one of the factors that cause outphasing system efficiency roll-off with more power back-off.

Figure 3A:
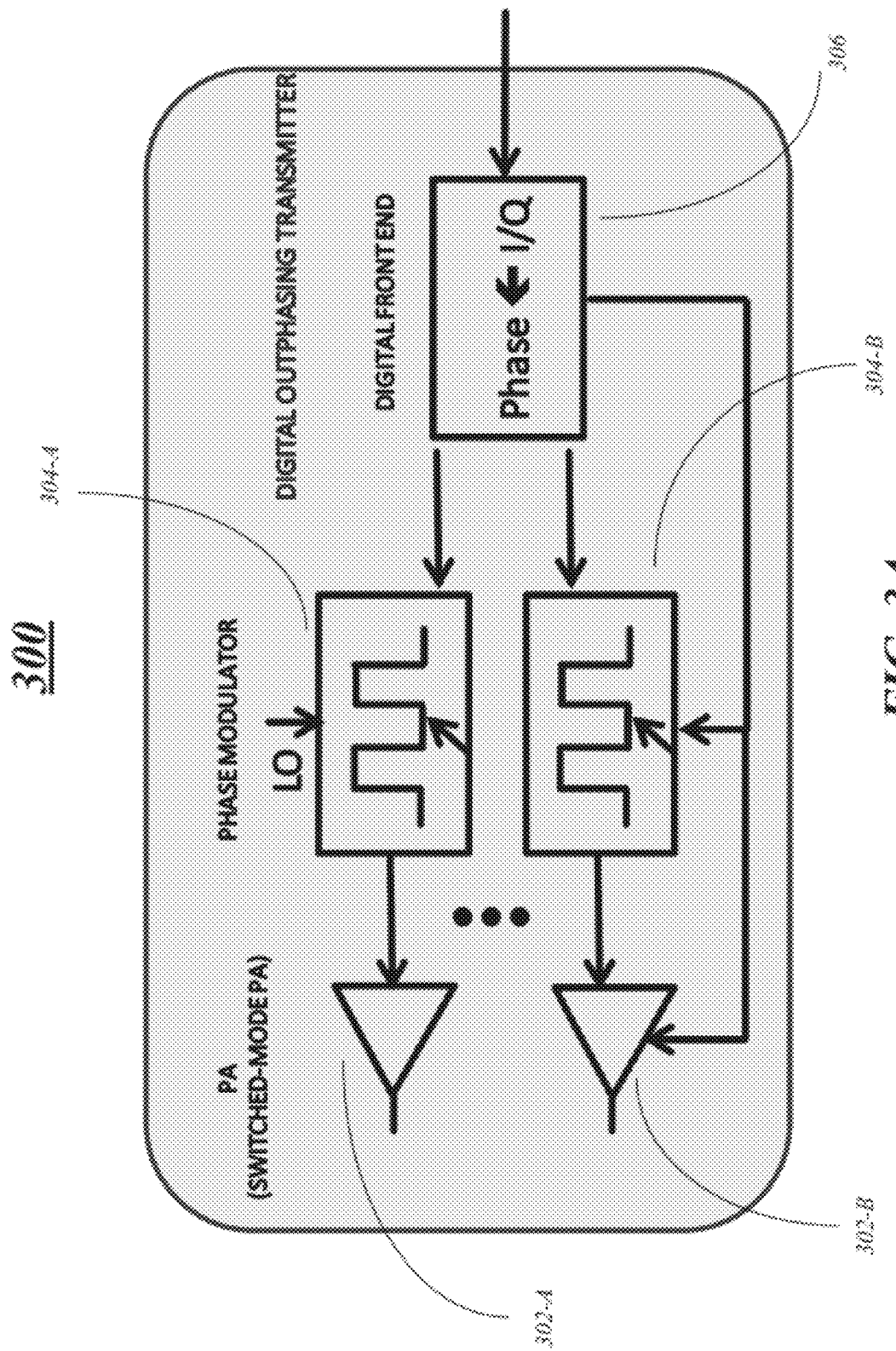
FIG. 3A illustrates one embodiment of a fourth apparatus.
Figures 3E, 3F, 3G, 3H:
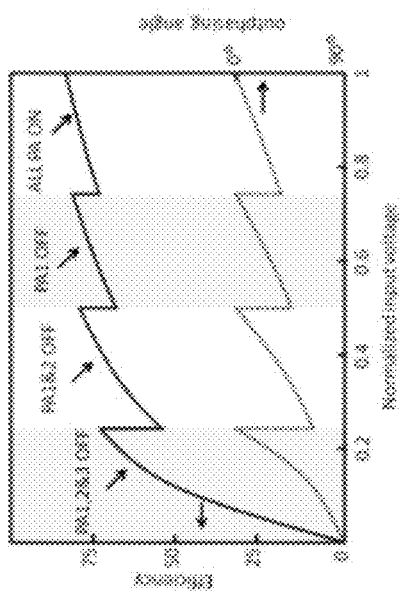
FIG. 3E illustrates one embodiment of a fifth graph.
FIG. 3F illustrates one embodiment of a sixth graph.
FIG. 3G illustrates one embodiment of a seventh graph.
FIG. 3H illustrates one embodiment of a eighth graph.

FIG. 3E, for example, illustrates efficiency curves for different back-off power or peak power for comparison. As shown in FIG. 3E, dotted lines may indicate total efficiency of an outphasing PA system including a PA driver. FIG. 3E illustrates that the back-off efficiency may drop significantly with higher PA driver power consumption. In various embodiments, modern CMOS technology may help to reduce PA driver power. However, in some embodiments, it may still be difficult to minimize it to a negligible level, especially for high power and high frequency operation (e.g. fast transistor on/off switching). These factors may limit the further improvement of back-off efficiency in an outphasing system.

To solve this and other problems such as boost back-off efficiency, the outphasing PA may be designed to consist of several outphasing PAs in some embodiments. For example, the output power of the PAs may be combined together through a power combiner to deliver full output power. In various embodiments, however, each unit PA may be turned on/off individually. Because most outphasing systems utilize switching PAs, it may be convenient to include this on/off feature. When PAs are shut down, both PA drivers and PA output transistors are off.

Power combiners for an outphasing transmitter system may be implemented using different approaches in some embodiments. For example, an isolated power combiner may be operative to provide up to a 3 dB power step when half of a PA group is off. In some embodiments, a non-isolating power combiner (e.g. a transformer) may be operative to provide up to a 6 dB power step if half of a whole PA is off. In various embodiments, the power control concept may be similar for both cases in that each PA can operate efficiently to have an optimal efficiency at its own peak power.

FIG. 3F illustrates an example efficiency curve based on a system that uses a transformer power combiner and four unit PAs for purposes of illustration and not limitation. In various embodiments, this outphasing PA consists of four unit PA cores. FIG. 3F shows four efficiency curves when a PA is on at full power and when PA cores are turned off one by one. The solid line in FIG. 3F illustrates the total efficiency curve if, for example, the PA can be dynamically configured to have the best efficiency at that power level. As can be seen in the figure, power savings can be achieved by dynamically controlling the PAs. Consequently, techniques for dynamic control for outphasing power amplifiers are desirable.

Figure 1:
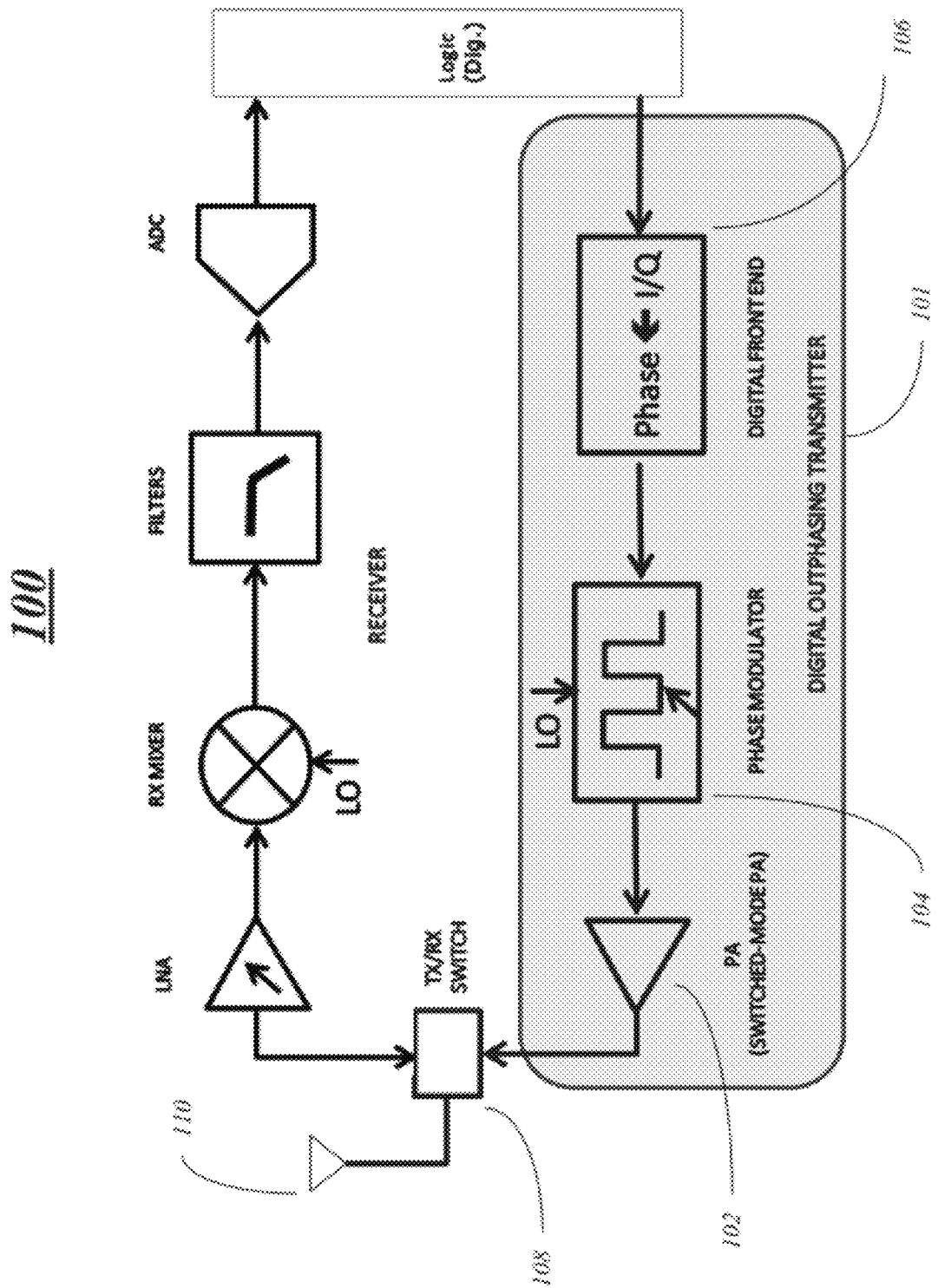
FIG. 1 illustrates one embodiment of a first apparatus.

FIG. 1 illustrates a block diagram of one embodiment of an outphasing RF transceiver 100 or part of a mobile computing device 100. In various embodiments, the mobile computing device 100 may comprise multiple components. A component or node generally may comprise any physical or logical entity for communicating information in the mobile computing device 100 or in a communications system and may be implemented as hardware, software, or any combination thereof, as desired for a given set of design parameters or performance constraints. Although FIG. 1 may show a limited number of components by way of example, it can be appreciated that more or less components may be employed for a given implementation.

In various embodiments, the mobile computing device 100 may comprise, or form part of a wired communications system, a wireless communications system, or a combination of both. For example, the mobile computing device 100 may include one or more nodes arranged to communicate information over one or more types of wired communication links. Examples of a wired communication link, may include, without limitation, a wire, cable, bus, printed circuit board (PCB), Ethernet connection, peer-to-peer (P2P) connection, backplane, switch fabric, semiconductor material, twisted-pair wire, co-axial cable, fiber optic connection, and so forth. The mobile computing device 100 also may include one or more nodes arranged to communicate information over one or more types of wireless communication links. Examples of a wireless communication link may include, without limitation, a radio channel, infrared channel, radio-frequency (RF) channel, Wireless Fidelity (WiFi) channel, a portion of the RF spectrum, and/or one or more licensed or license-free frequency bands.

The mobile computing device 100 may communicate information in accordance with one or more standards as promulgated by a standards organization. In one embodiment, for example, various devices comprising part of the mobile computing device 100 may be arranged to operate in accordance with one or more of the IEEE 802.16 standards for WMAN including standards such as 802.16-2004, 802.16.2-2004, 802.16e-2005, 802.16f, 802.16m progeny and variants; WGA (WiGig) progeny and variants or a 3GPP Long-Term Evolution (LTE) standard. In some embodiments, mobile computing device 100 may be arranged to communicate in accordance with any fourth generation (4G) network or radio technology progeny and variants.

In various embodiments, the mobile computing device 100 may be arranged to operate in accordance with one or more of the IEEE 802.11 standard, the WiGig Alliance™ specifications, WirelessHD™ specifications, standards or variants, such as the WirelessHD Specification, Revision 1.0d7, Dec. 1, 2007, and its progeny as promulgated by WirelessHD, LLC (collectively referred to as the "WirelessHD Specification"), or with any other wireless standards as promulgated by other standards organizations such as the International Telecommunications Union (ITU), the International Organization for Standardization (ISO), the International Electrotechnical Commission (IEC), the Institute of Electrical and Electronics Engineers (information IEEE), the Internet Engineering Task Force (IETF), and so forth. In various embodiments, for example, the mobile computing device 100 may communicate information according to one or more IEEE 802.11 standards for wireless local area networks (WLANs) such as the information IEEE 802.11 standard (1999 Edition, Information Technology Telecommunications and Information Exchange Between Systems—Local and Metropolitan Area Networks—Specific Requirements, Part 11: WLAN Medium Access Control (MAC) and Physical (PHY) Layer Specifications), its progeny and supplements thereto (e.g., 802.11a, b, g/h, j, n, VHT SG, and variants); IEEE 802.15.3 and variants; European Computer Manufacturers Association (ECMA) TG20 progeny and variants; and other wireless networking standards. The embodiments are not limited in this context.

The mobile computing device 100 may communicate, manage, or process information in accordance with one or more protocols. A protocol may comprise a set of predefined rules or instructions for managing communication among nodes. In various embodiments, for example, the mobile computing device 100 may employ one or more protocols such as a beam forming protocol, medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), a contention-based period (CBP) protocol, a distributed contention-based period (CBP) protocol and so forth. In various embodiments, the communications system 100 also may be arranged to operate in accordance with standards and/or protocols for media processing. The embodiments are not limited in this context.

In various embodiments, mobile computing device 100 may be implemented as various types of wireless devices. Examples of wireless devices may include, without limitation, a station, a subscriber station, a base station, a wireless access point (AP), a wireless client device, a wireless station (STA), a laptop computer, ultra-laptop computer, portable computer, personal computer (PC), notebook PC, handheld computer, personal digital assistant (PDA), cellular telephone, combination cellular telephone/PDA, smartphone, pager, messaging device, media player, digital music player, set-top box (STB), appliance, workstation, user terminal, mobile unit, consumer electronics, television, digital television, high-definition television, television receiver, high-definition television receiver, and so forth.

In some embodiments, mobile computing device 100 may include or comprise one more wireless interfaces and/or components for wireless communication such as one or more transmitters, receivers, transceivers, radios, chipsets, amplifiers, filters, control logic, network interface cards (NICs), antennas, antenna arrays, modules and so forth. Examples of an antenna may include, without limitation, an internal antenna, an omni-directional antenna, a monopole antenna, a dipole antenna, an end fed antenna, a circularly polarized antenna, a micro-strip antenna, a diversity antenna, a dual antenna, an antenna array, and so forth.

In various embodiments, mobile computing device 100 may comprise or form part of a wireless network. In one embodiment, for example, the wireless network may comprise a Worldwide Interoperability for Microwave Access (WiMAX) network. Although some embodiments may be described with the wireless network implemented as a WiMAX wireless network for purposes of illustration, and not limitation, it can be appreciated that the embodiments are not limited in this context. For example, the wireless network may comprise or be implemented as various types of wireless networks and associated protocols suitable for a Wireless Personal Area Network (WPAN), a Wireless Local Area Network (WLAN), a Wireless Metropolitan Area Network, a Wireless Wide Area Network (WWAN), a Broadband Wireless Access (BWA) network, a radio network, a cellular network, a television network, a satellite network such as a direct broadcast satellite (DBS) network, and/or any other wireless communications network configured to operate in accordance with the described embodiments. Other embodiments are described and claimed.

Outphasing RF transceiver 100 may form part of a mobile computing device in some embodiments. As shown in FIG. 1, mobile computing device 100 may include digital outphasing transmitter 101, PA 102, phase modulator 104, digital front end 106, switch 108 and antenna 110. Other components are shown for purposes of illustration but are not described in detail to for purposes of clarity. It should be understood that any suitable number or type of components having the same or similar functionality to those illustrated may be used and still fall within the described embodiments. Furthermore, while a limited number of components are shown in FIG. 1 for purpose of illustration, it should be understood that the embodiments are not limited to the number, type or arrangement of components, elements or modules shown in FIG. 1. Other embodiments are described and claimed.

FIG. 2A illustrates one embodiments of an apparatus 200. For example, apparatus 200 may comprise a digital outphasing transmitter 200. In some embodiments, digital outphasing transmitter 200 may comprise an expanded view of digital outphasing transmitter 101 of FIG. 1. As shown in FIG. 2A digital outphasing transmitter 200 may include PA 202, phase modulator 204 and digital front end 206. In various embodiments, an expanded view of PA 202 is shown at 240. As shown, PA 240 may include PAs 230-A-D, transformers 234, outphasing input 236 and outphasing input 238. Other embodiments are described and claimed.

In various embodiments PA 240 may comprise an improved power combiner design for outphasing PAs 230-A-D. For example, the power combiner of FIG. 2A may be arranged such that the combining for outphasing signals is done on a primary inductor and power combining for higher power (e.g. including differential signals) is done on a secondary inductor of transformers 234. This may be different, in various embodiments, than a traditional transformer power combiner that combines power through the secondary inductor. Other embodiments are described and claimed.

In various embodiments, digital outphasing transmitter 200 may comprise one or more outphasing power amplifiers 230-A-D. In some embodiments, PAs 230-A-D may comprise any suitable device that changes, usually increases, the amplitude of a signal. Digital outphasing transmitter 200 may also include one or more phase modulator modules 204 coupled to and operative to dynamically control the one or more outphasing power amplifiers 230-A-D in some embodiments. The one or more phase modulator modules 204 are described in more detail below with reference to FIGS. 3A-3H.

Digital outphasing transmitter 200 may include one or more power combiners 234 coupled to and operative to combine outputs from the one or more outphasing power amplifiers 230-A-D in some embodiments. In various embodiments, the power combiners may comprise transformer power combiners. The embodiments are not limited in this context.

In some embodiments, the one or more power combiners 234 may comprise transformer power combiners arranged to combine outphasing signals using a primary inductor and differential signals using a secondary inductor. For example, as shown in FIG. 2A, the one or more outphasing power amplifiers 230-A-D may comprise four outphasing power amplifiers arranged to receive a first 236 and second 238 digital signal as inputs from the one or more phase modulator modules 204 and/or from digital front end 206. In some embodiments, the first 236 and second 238 digital signals may comprise constant-amplitude signals having positive and negative components.

In various embodiments, a first outphasing power amplifier 230A may be arranged to receive the positive component of the first digital signal 236, a second outphasing power amplifier 230-B may be arranged to receive the negative component of the first digital signal 236, a third outphasing power amplifier 230-C may be arranged to receive the positive component of the second digital signal 238 and a fourth outphasing power amplifier 230-D may be arranged to receive the negative component of the second digital signal 238. The outputs of the first 230-A and fourth 230-D outphasing power amplifiers may be coupled together and the outputs of the second 230-B and third 230-C outphasing power amplifiers may be coupled together in some embodiments. For example, the coupling may be accomplished using one or more transformers 234 in some embodiments.

Figure 2G:
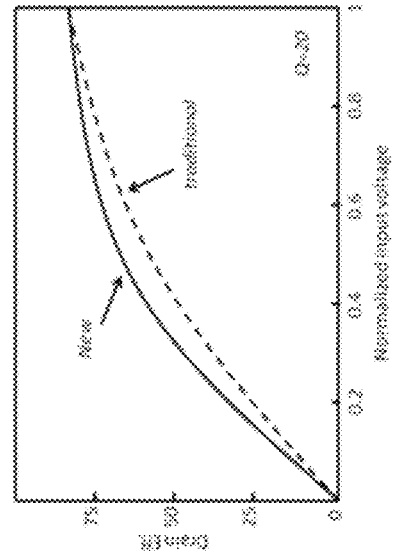
FIG. 2G illustrates one embodiment of a third graph.

In the architecture of FIG. 2A, in some embodiments, the Q factor of matching networks may remain constant regardless of the outphasing angle. As a result, the loss in the matching network may scale down as power levels back off from peak. The resulting matching network is shown, for example, in FIG. 2F and an example efficiency graph illustrating that the efficiency at back-off power remains at an acceptable level is shown in FIG. 2G.

As shown in FIG. 2B, this architecture may also be scaled up for higher output power by stacking two or more unit outphasing PAs together to boost power. For example, as shown in FIG. 2B, system 240-A and system 240-B, each similar to the described PA and combiner system 240 of FIG. 2A, may be stacked together to boost output power. In various embodiments, transformer power combiners may be used to boost output power levels for a digital outphasing transmitter while still achieving efficiency benefits for the outphasing system. Other embodiments are described and claimed.

FIG. 3A illustrates one embodiment of an apparatus 300. In some embodiments, apparatus 300 may comprise a digital outphasing transmitter 300 that is the same or similar to digital outphasing transmitters 101 of FIG. 1 or 200 of FIG. 2A. As shown in FIG. 3A, digital outphasing transmitter 300 may include PAs 302-A and 302-B, phase modulators 304-A and 304-B and digital front end 306. Other embodiments are described and claimed.

In various embodiments, digital outphasing transmitter 300 may comprise an architecture arranged to improve PA back-off efficiency. In some embodiments, improving the efficiency of the PAs may be an important consideration to conserve power consumption in wireless data transmission in mobile computing devices. In various embodiments, digital outphasing transmitter 300 may comprise a digital solution that may be easier to implement than previous solutions implemented in CMOS technology, for example.

FIGS. 3B, 3C and 3D illustrate embodiments of a digital outphasing transmitter similar to digital outphasing transmitter 300 of FIG. 3A. Each of the digital outphasing transmitters shown in FIGS. 3B-3D present different solutions to the problem of independently controlling the one or more PAs of a transmitter system. In some embodiments, the embodiments of FIGS. 3B-3D represent digital outphasing transmitter solutions wherein one or more phase modulator modules are operative to dynamically control one or more outphasing power amplifiers by selectively turning one or more of the outphasing power amplifiers on or off to increase an operating efficiency of the transmitter. The embodiments are not limited in this context.

FIG. 3B illustrates one embodiments of a digital outphasing transmitter that uses one phase modulator to generate common outphasing inputs s1 and s2 for all unit PAs. In some embodiments, one phase modulator module 304 may be operative to control the one or more outphasing power amplifiers 302. In various embodiments, this arrangement of an outphasing PA system may deliver peak output power when s1 and s2 are in-phase. In some embodiments, when one or more PA cores are dynamically on/off, the outphasing angle jumps between outphasing state and in-phase state. The phase modulator in this architecture may, in various embodiments, be required to handle abrupt phase change fast enough with minimum jittering. The abrupt jumps when the PA units turn on-off may increase the design challenge of phase modulator 304. In some embodiments, the arrangement of FIG. 3B may provide an advantage in that it is a simple system implementation.

FIG. 3C illustrates one embodiments of a digital outphasing transmitter that includes two phase modulators to control a plurality of PAs. For example, to eliminate the abrupt jumps in the phase modulator, a dual or ping-pong modulator scheme may be used. In various embodiments, two phase modulator modules 304 may be operative to control the one or more outphasing power amplifiers 302. In some embodiments, one of the phase modulator modules 304 may provide the required output for the current state of a PA. The second phase modulator module 304 may provide an output that corresponds to a next PA setting in some embodiments. In various embodiments, the next state power level may be obtained in advance from baseband or from any other suitable component. When some PA units need to be turned on-off, the second phase modulator module 304 may be ready to generate the correct phase for next state and this may reduce or eliminate the effects of settling. In this embodiment, the first modulator may subsequently then become the backup and may prepare for the next PA step, for example. In various embodiments, state scheduling for unit PAs and the phase modulator module is shown in an example embodiment included in the plot of FIG. 3G.

In various embodiments, a similar system may be designed with two back-up phase modulators. In some embodiments, for example, one phase modulator module may prepare for the case when more unit PAs are turned on and the other phase modulator module may prepare for the case when more turn off. In this manner, in some embodiments, the phase modulator may be able to react much faster with less interaction with the baseband/MAC of the mobile computing device. The embodiments are not limited in this context.

In some embodiments, FIG. 3D illustrates one embodiments of a digital outphasing transmitter system that includes a plurality of phase modulator modules 304, wherein each phase modulator module 304 is operative to control one of the one or more outphasing power amplifiers 302. For example, in various embodiments, each unit PA 302 may include its own phase modulator 304. In some embodiments, each phase modulator module 304 may operate only when the respective PA 302 needs to be modulated with outphasing signals. In various embodiments, state scheduling for unit PAs and phase modulators is shown in an example embodiment included in the plot of FIG. 3H. In some embodiments, each phase modulator may be operative to function only within its duty cycle. In this manner, overall power consumption in the phase modulator modules may not be higher than one phase modulator that works continuously. Also, in some embodiments, the required dynamic power range of each PA may be smaller which may further relax the phase resolution requirement of the phase modulator modules and power consumption in the phase modulator modules may also be reduced.

In various embodiments, the architectures of FIGS. 3B-3D may allow for the implementation of dynamic power control for an outphasing PA system. Selection of an appropriate architecture may be determined by the overall transmitter requirements and the quality of available phase modulator designs.

It should be understood that the digital outphasing transmitter designs described herein may be used in conjunction with any type of wireless communication protocol or standard and any suitable type of mobile computing device. In various embodiments, the digital outphasing transmitters described herein may be integrated on a semiconductor chip or die. Other embodiments are described and claimed.

Operations for various embodiments may be further described with reference to the following figures and accompanying examples. Some of the figures may include a logic flow. It can be appreciated that an illustrated logic flow merely provides one example of how the described functionality may be implemented. Further, a given logic flow does not necessarily have to be executed in the order presented unless otherwise indicated. In addition, a logic flow may be implemented by a hardware element, a software element executed by a processor, or any combination thereof. The embodiments are not limited in this context.

FIG. 4 illustrates one embodiment of a logic flow 400 for reducing power consumption for a digital outphasing transmitter. In various embodiments, the logic flow 400 may be performed by various systems, nodes, and/or modules and may be implemented as hardware, software, and/or any combination thereof, as desired for a given set of design parameters or performance constraints. For example, the logic flow 400 may be implemented by a logic device (e.g., node, STA, wireless device) and/or logic comprising instructions, data, and/or code to be executed by a logic device. For purposes of illustration, and not limitation, the logic flow 400 is described with reference to FIGS. 2A, 3B, 3C and 3D. The embodiments are not limited in this context.

In various embodiments, a positive component of a first digital signal may be received at a first outphasing power amplifier, a negative component of the first digital signal may be received at a second outphasing power amplifier, a positive component of a second digital signal may be received at a third outphasing power amplifier and a negative component of the second digital signal may be received at a fourth outphasing power amplifier at 402. For example, as shown in FIG. 2A, the positive component of outphasing input s1 may be received by PA 230-A, the negative component of s1 may be received by PA 230-B, the positive component of outphasing input s2 may be received by PA 230-C and the negative component of s2 may be received by PA 230-D.

At 404, in some embodiments, outputs of the first and fourth outphasing power amplifiers may be combined and outputs of the second and third outphasing power amplifiers may be combined using a primary and a secondary inductor. For example, as shown in FIG. 2A, transformers 234 may be used to couple the respective outputs of PAs 230-A-D.

In various embodiments, the outputs may be combined such that outphasing signals are combined using the primary inductor and differential signals are combined using the secondary inductor. In some embodiments, for example, the plurality of outphasing power amplifiers may form part of a transformer power combiner and the first and second digital signals may comprise constant-amplitude signals.

Dynamic control of the one or more outphasing power amplifiers may be implemented using one or more phase modulator modules in some embodiments. For example, as shown in FIGS. 3B-3D, different numbers and arrangements of phase modulator modules 304 may be used to dynamically control any number of PAs 302. In some embodiments, for example, dynamic control of one or more outphasing power amplifiers may be implemented using one phase modulator module. As shown in FIG. 3B, for example, one phase modulator module 304 may control one or more PAs 302.

In various embodiments, one or more outphasing power amplifiers may be dynamically controlled using two phase modulator modules. For example, the two phase modulator modules 304 of FIG. 3C may be arranged to control the PAs 302. In some embodiments, each of the one or more outphasing power amplifiers may be dynamically controlled with a separate phase modulator module. As shown in FIG. 3D, for example, each PA 302 may include its own separate and dedicated phase modulator module 304. Other embodiments are described and claimed.

Figure 5:
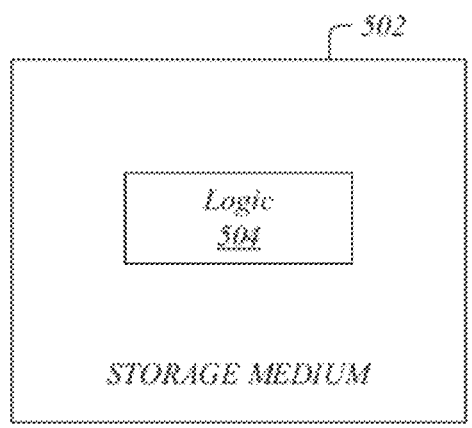
FIG. 5 illustrates one embodiment of an article of manufacture.

FIG. 5 illustrates one embodiment of an article of manufacture 500. As shown, the article 500 may comprise a storage medium 502 to store logic 504 for managing power for a mobile computing device in some embodiments. For example, logic 504 may be used to implement phase modulator or other module for a mobile computing device, node or other system, as well as other aspects of a mobile computing device as described elsewhere herein. In various embodiments, the article 500 may be implemented by various systems, nodes, and/or modules.

The article 500 and/or machine-readable or computer-readable storage medium 502 may include one or more types of computer-readable storage media capable of storing data, including volatile memory or, non-volatile memory, removable or non-removable memory, erasable or non-erasable memory, writeable or re-writeable memory, and so forth. In some embodiments, the store medium 502 may comprise a non-transitory storage medium. Examples of a machine-readable storage medium may include, without limitation, random-access memory (RAM), dynamic RAM (DRAM), Double-Data-Rate DRAM (DDR-DRAM), synchronous DRAM (SDRAM), static RAM (SRAM), read-only memory (ROM), programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk (e.g., floppy disk, hard drive, optical disk, magnetic disk, magneto-optical disk), or card (e.g., magnetic card, optical card), tape, cassette, or any other type of computer-readable storage media suitable for storing information. Moreover, any media involved with downloading or transferring a computer program from a remote computer to a requesting computer carried by data signals embodied in a carrier wave or other propagation medium through a communication link (e.g., a modem, radio or network connection) is considered computer-readable storage media.

The article 500 and/or machine-readable medium 502 may store logic 504 comprising instructions, data, and/or code that, if executed by a machine, may cause the machine to perform a method and/or operations in accordance with the described embodiments. Such a machine may include, for example, any suitable processing platform, computing platform, computing device, processing device, computing system, processing system, computer, processor, or the like, and may be implemented using any suitable combination of hardware and/or software.

The logic 504 may comprise, or be implemented as, software, a software module, an application, a program, a subroutine, instructions, an instruction set, computing code, words, values, symbols or combination thereof. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context. When the logic 504 is implemented as software, any suitable processor and memory unit may execute the software.

FIG. 6 is a diagram of an exemplary system embodiment. In particular, FIG. 6 is a diagram showing a system 600, which may include various elements. For instance, FIG. 6 shows that system 600 may include a processor 602, a chipset 604, an input/output (I/O) device 606, a random access memory (RAM) (such as dynamic RAM (DRAM)) 608, and a read only memory (ROM) 610, and various platform components 614 (e.g., a fan, a crossflow blower, a heat sink, DTM system, cooling system, housing, vents, and so forth). These elements may be implemented in hardware, software, firmware, or any combination thereof. The embodiments, however, are not limited to these elements.

As shown in FIG. 6, I/O device 606, RAM 608, and ROM 610 are coupled to processor 602 by way of chipset 604. Chipset 604 may be coupled to processor 602 by a bus 612. Accordingly, bus 612 may include multiple lines.

Processor 602 may be a central processing unit comprising one or more processor cores and may include any number of processors having any number of processor cores. The processor 602 may include any type of processing unit, such as, for example, CPU, multi-processing unit, a reduced instruction set computer (RISC), a processor that have a pipeline, a complex instruction set computer (CISC), digital signal processor (DSP), and so forth.

Although not shown, the system 600 may include various interface circuits, such as an Ethernet interface and/or a Universal Serial Bus (USB) interface, and/or the like. In some exemplary embodiments, the I/O device 606 may comprise one or more input devices connected to interface circuits for entering data and commands into the system 600. For example, the input devices may include a keyboard, mouse, touch screen, track pad, track ball, isopoint, a voice recognition system, and/or the like. Similarly, the I/O device 606 may comprise one or more output devices connected to the interface circuits for outputting information to an operator. For example, the output devices may include one or more digital displays, printers, speakers, and/or other output devices, if desired. For example, one of the output devices may be a digital display. The display may be a cathode ray tube (CRTs), liquid crystal displays (LCDs), light emitting diode (LED) display or any other type of display.

The system 600 may also have a wired or wireless network interface to exchange data with other devices via a connection to a network. The network connection may be any type of network connection, such as a wireless connection or a wired connection, including but not limited to a cellular connection, radio frequency connection, an Ethernet connection, digital subscriber line (DSL), telephone line, coaxial cable, etc. The network may be any type of network, such as the Internet, a telephone network, a cable network, a wireless network, a packet-switched network, a circuit-switched network, and/or the like.

The foregoing represent are only a few examples of the problems that may be overcome by implementing a method and apparatus to manage MBS data in a wireless communications system, and it may be appreciated that other problems may be overcome and other advantages may exist as well.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable or computer-readable medium or article which may store an instruction, a set of instructions or computer executable code that, if executed by a machine or processor, may cause the machine or processor to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, volatile or non-volatile memory or media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter that lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It is also worthy to note that any reference to "one embodiment" or "an embodiment" means that a particular feature, structure, or characteristic described in connection with the embodiment is included in at least one embodiment. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
one or more outphasing power amplifiers;
one or more phase modulator modules coupled to the one or more outphasing power amplifiers, the one or more phase modulator modules operative to dynamically control the one or more outphasing power amplifiers; and
one or more power combiners coupled to the one or more outphasing power amplifiers, the one or more power combiners operative to combine outputs from the one or more outphasing power amplifiers, wherein the one or more power combiners comprise transformer power combiners arranged to combine outphasing signals using a primary inductor and differential signals using a secondary inductor.

2. The apparatus of claim 1, wherein the one or more outphasing power amplifiers comprise four outphasing power amplifiers arranged to receive a first and second digital signal as inputs from the one or more phase modulator modules, wherein the first and second digital signals comprise constant-amplitude signals having positive and negative components.

3. The apparatus of claim 2, wherein a first outphasing power amplifier is arranged to receive the positive component of the first digital signal, a second outphasing power amplifier is arranged to receive the negative component of the first digital signal, a third outphasing power amplifier is arranged to receive the positive component of the second digital signal and a fourth outphasing power amplifier is arranged to receive the negative component of the second digital signal.

4. The apparatus of claim 3, wherein the outputs of the first and fourth outphasing power amplifiers are coupled together and the outputs of the second and third outphasing power amplifiers are coupled together, wherein the coupling includes a transformer.

5. The apparatus of claim 1, comprising multiple stacked power combiners.

6. The apparatus of claim 1, wherein the one or more phase modulator modules are operative to dynamically control the one or more outphasing power amplifiers by selectively turning one or more of the outphasing power amplifiers on or off to increase an operating efficiency of the apparatus.

7. The apparatus of claim 6, comprising one phase modulator module operative to control the one or more outphasing power amplifiers.

8. The apparatus of claim 6, comprising two phase modulator modules operative to control the one or more outphasing power amplifiers.

9. The apparatus of claim 6, comprising multiple phase modulator modules, wherein each phase modulator module is operative to control one of the one or more outphasing power amplifiers.

10. The apparatus of claim 1, comprising an outphasing radio frequency (RF) transceiver, wherein the one or more outphasing power amplifiers, the one or more phase modulator modules and the one or more power combiners form part of a digital outphasing transmitter of the RF transceiver and wherein the digital outphasing transmitter is integrated on a semiconductor chip.

11. A method, comprising:
receiving a positive component of a first digital signal at a first outphasing power amplifier, a negative component of the first digital signal at a second outphasing power amplifier, a positive component of a second digital signal at a third outphasing power amplifier and a negative component of the second digital signal at a fourth outphasing power amplifier; and
combing outputs of the first and fourth outphasing power amplifiers using a primary inductor and outputs of the second and third outphasing power amplifiers using a secondary inductor, such that outphasing signals are combined using the primary inductor and differential signals are combined using the secondary inductor.

12. The method of claim 11, wherein the multiple outphasing power amplifiers form part of a transformer power combiner and the first and second digital signals comprise constant-amplitude signals.

13. The method of claim 11, comprising:
dynamically controlling the one or more outphasing power amplifiers using one or more phase modulator modules.

14. The method of claim 13, comprising:
dynamically controlling the one or more outphasing power amplifiers using one phase modulator module.

15. The method of claim 13, comprising:
dynamically controlling the one or more outphasing power amplifiers using two phase modulator modules.

16. The method of claim 13, comprising:
dynamically controlling each of the one or more outphasing power amplifiers with a separate phase modulator module.

17. A transmitter, comprising:
multiple outphasing power amplifiers operative to receive a positive component of a first digital signal at a first outphasing power amplifier, a negative component of the first digital signal at a second outphasing power amplifier, a positive component of a second digital signal at a third outphasing power amplifier and a negative component of the second digital signal at a fourth outphasing power amplifier; and
one or more transformer power combiners arranged to combine outputs of the first and fourth outphasing power amplifiers using a primary inductor of one of the transformer power combiners and outputs of the second and third outphasing power amplifiers using a secondary inductor of the transformer power combiner, such that outphasing signals are combined using the primary inductor and differential signals are combined using the secondary inductor.

18. The transmitter of claim 17, wherein the multiple outphasing power amplifiers form part of the transformer power combiner and the first and second digital signals comprise constant-amplitude signals.

19. The transmitter of claim 17, comprising:
one or more phase modulator modules operative to dynamically control the one or more outphasing power amplifiers.

20. The transmitter of claim 19, comprising:
one phase modulator module operative to dynamically control the one or more outphasing power amplifiers.

21. The transmitter of claim 19, comprising:
two phase modulator modules operative to dynamically control the one or more outphasing power amplifiers.

22. The transmitter of claim 19, comprising:
multiple phase modulator modules, wherein each phase modulator module is operative to dynamically control one of multiple outphasing power amplifiers.

* * * * *

UNITED STATES PATENT AND TRADEMARK OFFICE
CERTIFICATE OF CORRECTION

| | | |
|---|---|---|
| PATENT NO. | : 8,472,896 B2 | Page 1 of 1 |
| APPLICATION NO. | : 12/879252 | |
| DATED | : June 25, 2013 | |
| INVENTOR(S) | : Hongtao Xu et al. | |

It is certified that error appears in the above-identified patent and that said Letters Patent is hereby corrected as shown below:

In the Claims:

In column 14, line 58, in claim 11, delete "combing" and insert -- combining --, therefor.

Signed and Sealed this
Tenth Day of September, 2013

Teresa Stanek Rea
*Acting Director of the United States Patent and Trademark Office*